United States Patent [19]

Nestor

[11] 4,005,924
[45] Feb. 1, 1977

[54] UNIVERSAL WEDGE BASE LAMP SOCKET

[75] Inventor: Charles R. Nestor, Niles, Ohio

[73] Assignee: General Motors Corporation, Detroit, Mich.

[22] Filed: Oct. 14, 1975

[21] Appl. No.: 622,095

[52] U.S. Cl. .......................... 339/17 D; 339/125 L; 339/127 R
[51] Int. Cl.² .......................................... H05K 1/18
[58] Field of Search .......... 339/17 D, 127 R, 125 L

[56] References Cited

UNITED STATES PATENTS

| 2,774,949 | 12/1956 | Cardani et al. ............... 339/17 D X |
| 3,050,705 | 8/1962 | Benson ........................... 339/17 D |

*Primary Examiner*—Roy Lake
*Assistant Examiner*—E. F. Desmond
*Attorney, Agent, or Firm*—J. C. Evans

[57] ABSTRACT

A lamp socket and panel mount assembly for a printed circuit board includes a lamp socket having a bulb opening at one end thereof with terminal means therein for electrical connection to a bulb and with the terminal means including radially outwardly directed tab portions for electrical connection to leads of a printed circuit board when the housing is supported on a mounting panel; the housing includes locator and stop surfaces thereon to permit insertion thereof from either side of the printed circuit board and mounting panel into a fixed axial relationship with the panel wherein rotation of the housing with respect to the panel electrically connects the tab portions to circuit board leads and positions locator and stop surfaces on the housing to secure it and a flexible printed circuit board to the mounting panel.

3 Claims, 9 Drawing Figures

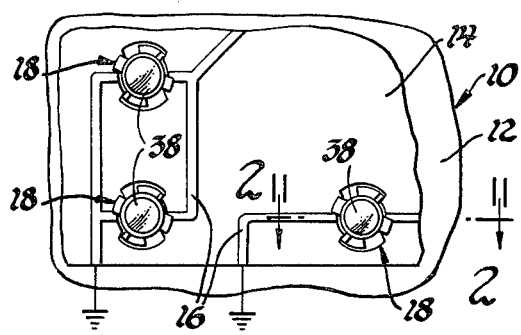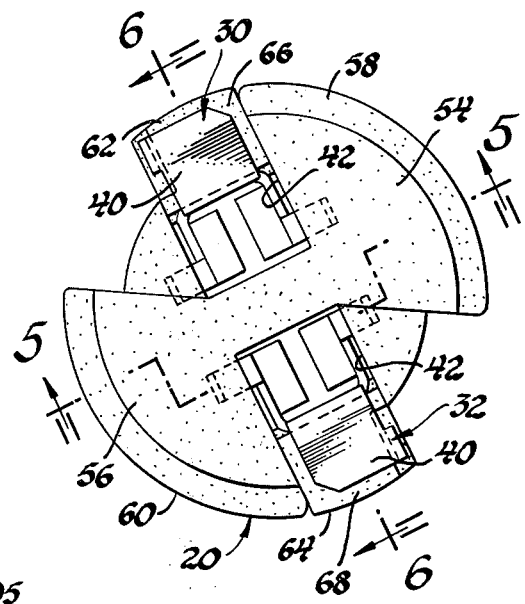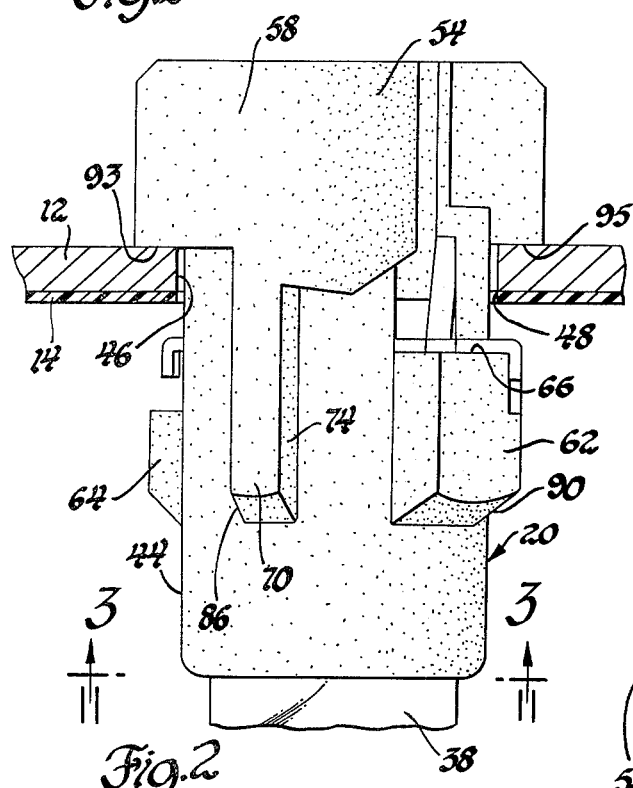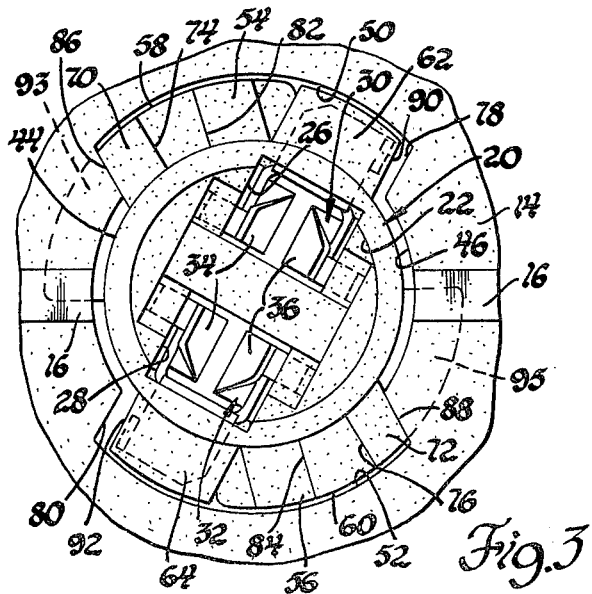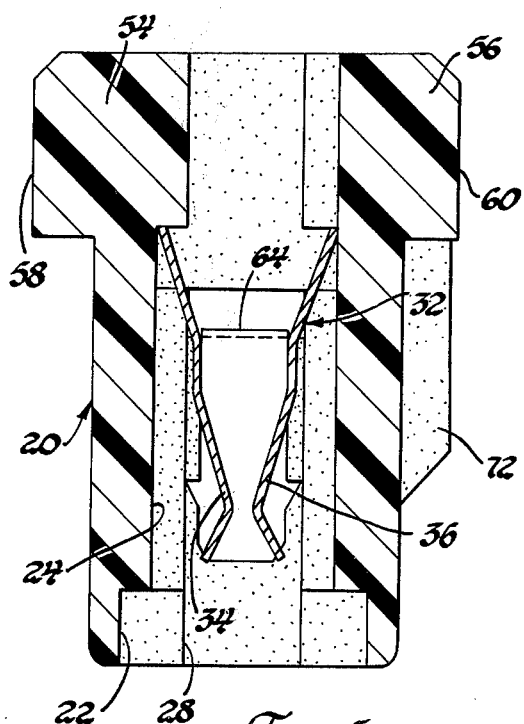

UNIVERSAL WEDGE BASE LAMP SOCKET

This invention relates to bulb socket and panel mounting assemblies and more particularly to bulb socket and panel mounted assemblies for use in printed circuit board applications in which a bulb socket and bulb component can be removably inserted on a mounting panel with a printed circuit board thereon.

Printed circuit boards used in confined spaces such as instrument panels of automotive vehicles include a support panel upon which a flexible circuit board is located of the type having a plurality of electrically conductive strips thereon configured to form circuits to a plurality of socket assemblies that support miniaturized bulbs for illuminating various indicia on the instrument panel. A bulb socket is configured to include means for axially guiding the socket onto the panel and locking means for securing it in place on the mounting panel along with the circuit board component. In the past the sockets have been configured to be either insertable from the rear of the support panel or from the front thereof and thereafter rotated into a locked position wherein a pair of terminal ears or tabs are located in engagement with the electrically conductive strips to complete a circuit across a bulb supported in the socket.

An example of a bulb socket assembly for insertion from the front of a printed circuit board is set forth in U.S. Pat. No. 2,953,769 issued Sept. 20, 1960 to R. C. Woofter et al.

Rear mounted socket assemblies for use in printed circuit boards are set forth in U.S. Pat. No. 3,001,165 issued Sept. 19, 1961 to R. C. Woofter et al.

While such arrangements are suitable for their intended purpose, insertion and subsequent removal must be made from the same side of the panel. In some cases, it is easier to assemble the socket either from the front or the rear during original assembly of the printed circuit board panel. However, under field service conditions, the panel may be located in a relationship which makes it difficult to remove the socket in the same direction as it was installed. For example, often rear mounted sockets, when assembled on a vehicle, are located in close proximity to the fire wall behind the instrument panel making removal from the rear difficult or impossible. Likewise originally installed front mounted socket assemblies may have forwardly located components of an instrument panel secured thereover which must be removed for socket replacement. In some cases, field service time can be reduced if the printed circuit board socket assembly is accessible from the rear.

Accordingly, an object of the present invention is to improve lamp socket assemblies for association with printed circuit boards having means thereon to permit universal front and rear installation and removal and to do so by means that will axially locate the socket for insertion in a socket mounting hole and including means for axially indexing the socket for subsequent rotation into a locked relationship on the mounting panel to retain a circuit board component thereon and to complete an electrical connection between electrically conductive strips on the panel and terminal components on the socket.

Still another object of the present invention is to provide an improved bulb socket and panel mounting assembly for use in printed circuit board applications wherein the bulb socket includes first and second radially outwardly directed locator surfaces thereon selectively arranged for guided insertion from opposite sides of a circuit board mounting panel through an opening therein wherein one or the other of the locator surfaces serves as an axial index stop surface when the other of the locator surfaces is axially directed through the mounting panel and wherein means are provided on at least one of the locator surfaces to index the socket following rotation thereof into a locked position on the panel.

Still another object of the present invention is to improve lamp sockets for association with printed circuit board panels having socket mounting openings therein by providing a socket housing universally insertable from either the front or rear of a printed circuit board mounting panel including index means for guiding the housing from either side of the panel into an axial stop position for subsequent rotation into a locked position on the panel upon insertion thereof from either side of the panel and wherein the index means includes a surface serving as an index following rotation of the socket housing into a locked position on the panel.

Further objects and advantages of the present invention will be apparent from the following description, reference being had to the accompanying drawings wherein a preferred embodiment of the present invention is clearly shown.

IN THE DRAWINGS

FIG. 1 is a front elevational view of a mounting panel, circuit board and a plurality of lamp socket assemblies constructed in accordance with the present invention;

FIG. 2 is an enlarged horizontal sectional view taken along the line 2—2 of FIG. 1 looking in the direction of the arrows;

FIG. 3 is an end elevational view taken along the line 3—3 of FIG. 2 looking in the direction of the arrows;

FIG. 4 is an end elevational view of the socket in FIG. 3 from the opposite end thereof;

FIG. 5 is a cross-sectional view taken along the line 5—5 of FIG. 4 looking in the direction of the arrows;

Figure 6:
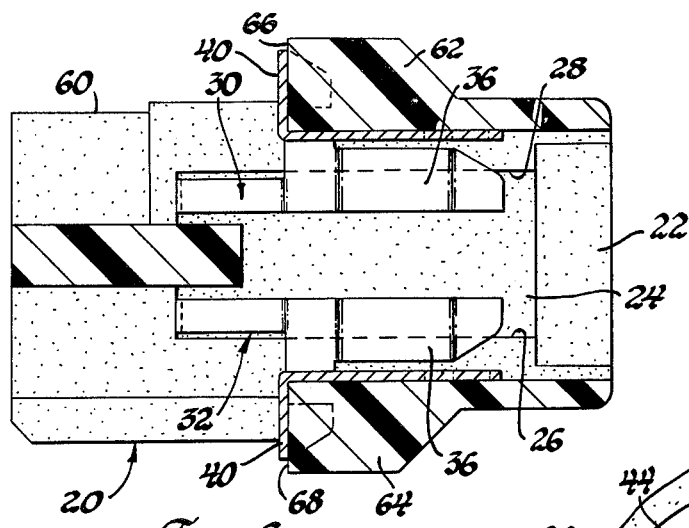
FIG. 6 is a cross-sectional view taken along the line 6—6 of FIG. 4 looking in the direction of the arrows.

Referring now to the drawings, in FIG. 1 a fragmentary front elevational view of a printed circuit board assembly 10 is illustrated. It is of the type often found on automotive instrument panels and includes a printed circuit board having a plurality of sockets secured thereon including miniaturized bulbs secured therein and electrically connected through terminal means on the socket to electrically conductive strips of the circuit board. More particularly, the assembly 10 includes a back mounting panel 12 which serves as the substrate for a flexible circuit board 14 having a network of electrically conductive strips 16 thereon for connection to a power source and to ground so as to complete an electrical circuit across the miniaturized lamp components.

As shown in FIG. 1, the assembly 10 includes a plurality of bulb socket assemblies 18 thereon, each of a universal type that can be inserted and removed from either the front or the rear of the assembly 10 in accordance with the present invention. Each of the assemblies 18 includes a socket housing 20 of plastic electrical insulating material having a bulb access opening 22 at one end thereof in communication with a bulb base recess 24 having a pair of spaced parallel side slots 26, 28 therein which supportingly receive wedge configured terminals 30, 32, respectively. The wedge configured terminals 30, 32 each include flexible bent spring contacts 34, 36 adapted to receive the base of a miniaturized bulb 38. Each of the terminals 30, 32 has a bent ear 40 directed radially outwardly of the bore 24 through a side opening 42 in the housing. The bent ears 40 on each of the wedge type terminals 30, 32 form diametrically spaced electrical contacts engageable with the network 16 of electrically conductive strips on the circuit board panel 14 when the socket is locked in place thereon.

The housing 20 has an outer wall 44 of a diameter slightly less than a centrally located circular opening 46 in the mounting panel 12 and a like circular opening 48 in the circuit board 14 in axial alignment with the opening 46. Mounting access of the socket housing 20 to the mounting panel 12 and printed circuit board 14 also is in part provided by a pair of diametrically located guide slots 50, 52 located radially outwardly of the aligned central openings 46, 48 extending through both the mounting panel 12 and the printed circuit board 14 to axially guide the housing 20 onto the mounting panel 12 and the printed circuit board 14.

The socket housing 20 includes a first pair of diametrically located lugs 54, 56 on the end thereof opposite to the bulb opening 22. The lugs 54, 56 have radially outwardly located circumferentially extending surfaces 58, 60 respectively that are congruent with the slots 50, 52 to guidingly direct the housing 20 for axial insertion from the front of the assembly 10 as illustrated in FIG. 1. Such axial insertion is limited by a second pair of diametrically located radially outwardly directed lugs 62, 64 having axial stop surfaces 66, 68, respectively that additionally serve as a back support for the radially outwardly directed bent ears 40 of each of the terminals 30, 32. As best seen in FIG. 4, the pair of radially outwardly directed lugs 62, 64 are circumferentially offset from the radial lugs 54, 56 so that they will be in interference relationship with the front surface of the circuit board 14 upon initial axial insertion of the lugs 54, 56 through the guide slots 50, 52.

The housing 20 further includes a pair of radially outwardly directed axially extending ribs 70, 72 arcuately offset from the lugs 62 and 64 on the outer wall 44 of the housing 20 and in axial alignment with the lugs 54, 56 so as to clear the slots 50, 52 as the lugs 54, 56 are axially directed through the slots 50, 52 from the front of the assembly 10. The ribs 70, 72 have index surfaces 74, 76 thereon that engage segments 78, 80 of the slots 50, 52 respectively to locate the housing 20 in an indexed stopped position when it is fastened by rotation onto the mounting panel 12 and circuit board 14.

Figure 7:
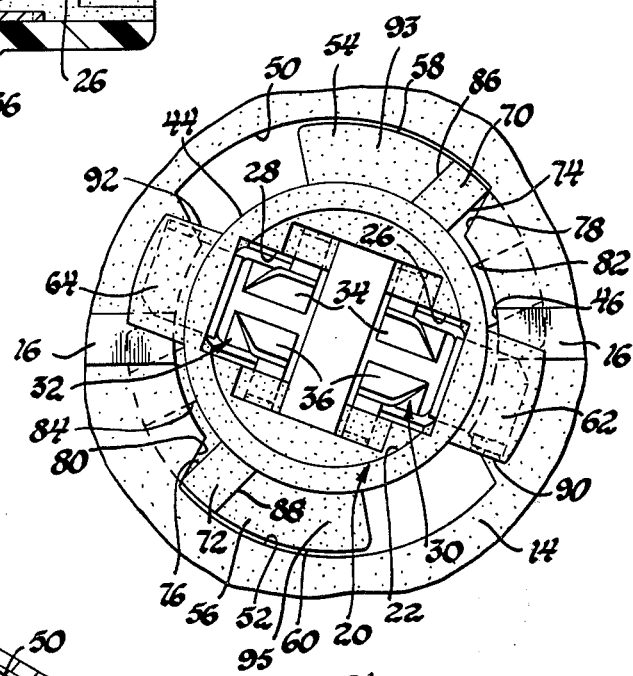
FIG. 7 is an end elevational view showing the socket of the present invention locked in place on a mounting panel.

When the socket housing 20 has been axially inserted from the front of the assembly 10 and rotated to its fastened position, the bent ears 40 are located to electrically contact the network 16 to complete a circuit from a power source to ground. Additionally, rotation of the housing 20 into its fastened position will cause inclined surfaces 82, 84 on the radial lugs 54, 56 to contact the backside of the mounting panel 12 at a point circumferentially spaced from the slots 50, 52 so as to hold the printed circuit board 14 securely to the mounting panel 12 as is best seen in FIG. 7. The ribs 70, 72 also include axial guide surfaces 86, 88, respectively, arcuately located with respect to a second pair of axial guide surfaces 90, 92 formed on the radially outwardly directed lugs 62, 64. The axial guide surfaces 88, 92 are arcuately spaced apart slightly less than the arcuate extent of the guide slot 52 and the guide surfaces 86, 90 are arcuately spaced apart a like amount to be received within the guide slot 50. Thus, to insert the socket housing 20 and bulb 38 therein from the rear of the panel 12, the lugs 62, 64 are located with the surfaces 90, 92 thereon located closely adjacent the previously described side segments 78, 80 and the ribs 70, 72 are located adjacent the opposite side of the guide slots 50, 52 and the socket housing 20 is inserted through the guide slots 50, 52 until stop surfaces 93, 95 on the radial lugs 54, 56 contact the back surface of the mounting panel 12. This location is shown in FIGS. 2 and 3. At this point the housing 20 is rotated to cause inclined surfaces 80, 82 to pull socket housing 20 into the assembly 10 where ears 40 can electrically contact the network 16. The ribs 70, 72 have the index surfaces 74, 76 thereon moved to the previously described position wherein the socket housing 20 is fixed to the mounting panel 12 and printed circuit board 14 for securing them together and to complete an electrical circuit between the bent ears 40 of the terminals 32, 33.

Figure 8:
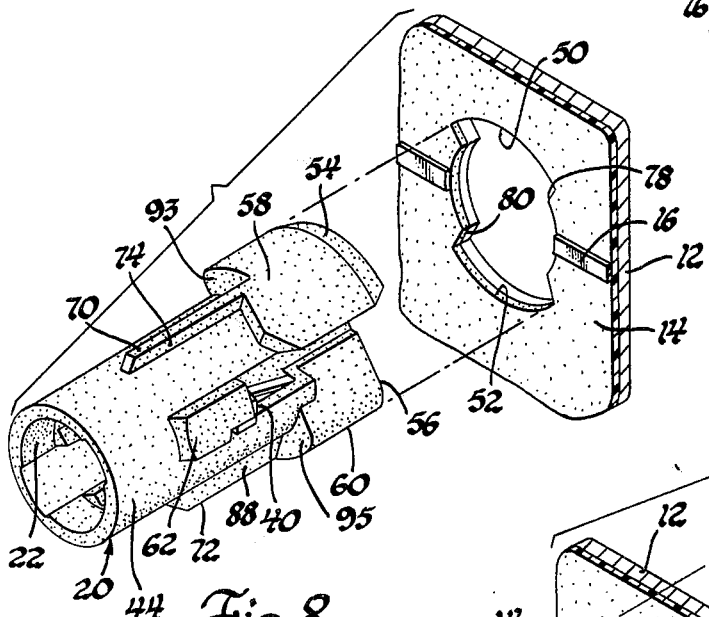
FIG. 8 is an exploded perspective view showing the socket of FIG. 7 located for insertion from one side of a mounting panel.

The front insertion position of the socket housing 20 and the socket mounting panel 12 opening 46 in guide slots 50, 52 is shown in FIG. 8 which shows the relationship of the outer circumferential surfaces 58, 60 on the lugs 54, 56 as the socket housing 20 is aligned for insertion from the front of the panel. Lugs 54, 56 will pass into guided relationship with the slots 50, 52 until the ears 40 engage the front of the printed circuit board 14. Then the socket housing 20 is rotated clockwise as viewed in FIG. 8 until the index surfaces 74, 76 on the ribs 70, 72 engage the side wall segments 78, 80 at which point the socket is secured on the front with the bulb 38 being located forwardly thereof. In order to remove the socket from the front of the panel the aforesaid procedure is reversed. On rear removal, the socket housing 20 is rotated until the axial guide surfaces 88, 90 and 86, 92 are in axial alignment with the side wall segments of the guide slots 50, 52. This permits the bulb and socket to be removed from the rear of the panel.

Figure 9:
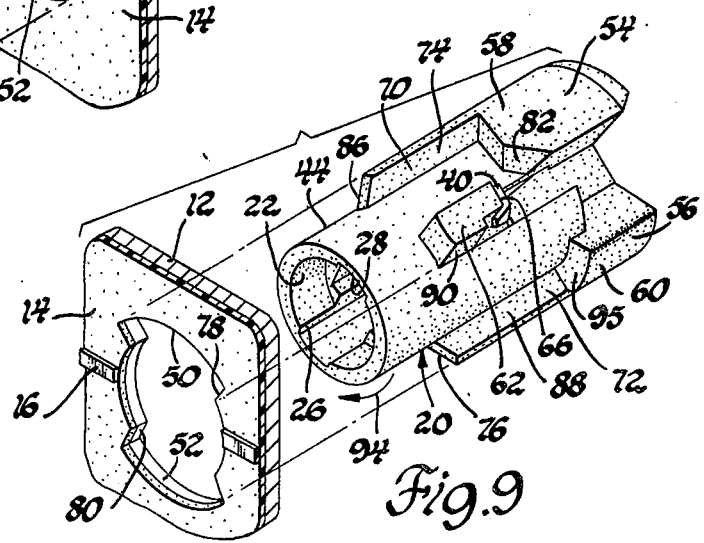
FIG. 9 is like FIG. 8 showing the socket in position for mounting from the opposite side of the panel shown in FIG. 8.

The completely universal mounting capabilities of the socket housing 20 is further demonstrated in FIG. 9 which shows the angular relationship of the socket housing 20 and the various guide and index surfaces thereon with respect to the panel opening prior to insertion from the rear of the mounting panel 12. In this case as shown in phantom lines the guide surfaces 88, 92 and 86, 90 are located at the side wall segments of the slots 50, 52 and the housing 20 is free to be axially inserted from the rear side until the stop surfaces 93, 95 on the lugs 54, 56 contact the back surface of the mounting panel 12. At this point, the housing 20 is rotated in the direction of the arrow 94 shown in FIG. 9 to cause the index surfaces 74, 76 to contact the side segments 78, 80 to again lock the socket housing 20 in place. In order to remove a rear mounted socket housing 20 from the front of the mounting panel 12, the wall 44 of housing 20 which extends forwardly of the front of the circuit board 14 is rotated in a direction opposite to that of the arrow in FIG. 9 to a point where the radially outwardly directed lugs 54, 56 are axially aligned with the slots 50, 52 at which point the whole housing 20 can be pulled through the mounting panel 12 and circuit board 14.

The aforedescribed sequence of assembly and removable from both front and rear of a mounting panel shows the absolute flexibility of the improved lamp socket assembly of the present invention. Use of a single part having the complete universal application of assembly from either front or rear and removable from an opposite side of a mounting panel enables a single piece part to be used in place of lamp socket assemblies adapted solely for insertion from the rear or front of a panel. Furthermore, in addition to serving as both a front or rear mounted socket, the socket can be removed from an opposite direction so as to optimize field service conditions for different applications.

While the embodiment of the present invention, as herein disclosed, constitutes a preferred form, it is to be understood that other forms might be adopted.

The embodiments of the invention in which an exclusive property or privilege is claimed are defined as follows:

1. A printed circuit bulb socket and panel mounting assembly for connecting a bulb socket to a circuit board from either side of the board comprising: a mounting board having a circular opening with radially outer guide slots defining arcuately located index surfaces thereon, a socket housing having an outer surface for insertion through said circular opening, a first pair of locater means on said housing extending axially at only one end thereof, a second pair of locater means on the housing extending axially at only the opposite end thereof, stop surfaces formed on said first pair of axial locater means, stop surfaces formed on said second pair of axial locater means, said first pair of locater means being located in axially guided engagement with the index surfaces when said housing is inserted from one side of the board, said stop surfaces on said second pairs of locater means being engageable with the board to limit axial insertion of the housing from the one side of the board and to locate the housing for rotation with respect to the board to a locked position where the board is held between said first and second pairs of locater means, said second pair of locater means being locatable in alignment with said guide slots for axially guided insertion of the housing from the opposite side of the board with said stop surfaces on said first pair of locater means locating the housing for rotation into the aforesaid locked position with the board held between said first and second pair of locater means, terminals on said housing located in electrical contact with said board when said housing is in its rotatably locked position, said first and second pair of locater means and the stop surfaces thereon preventing movement of the housing totally through said hole upon insertion of the housing from opposite sides thereof.

2. A printed circuit bulb socket and panel mounting assembly for connecting a bulb socket to a circuit board from either side of the board comprising: a mounting board having a circular opening with radially outer guide slots defining arcuately located index surfaces thereon, a socket housing having an outer surface for insertion through said circular opening, a first pair of locater lugs on said housing extending axially at only one end thereof, a second pair of locater lugs on the housing extending axially at only the opposite end thereof, a pair of longitudinal ribs on said housing at a point arcuately spaced from said second pair of locater lugs, stop surfaces formed on said first pair of axial locater lugs, stop surfaces formed on said second pair of axial locater lugs, said first pair of locater lugs located in axially guide engagement with the index surfaces when said housing is inserted from one side of the board, said stop surfaces on said second pairs of locater lugs being engageable with the board to limit axial insertion of the housing from the one side of the board and to locate the housing for rotation with respect to the board to a locked position where the board is held between said first and second pairs of locater lugs, said second pair of locater lugs and said longitudinal ribs being locatable in alignment with said guide slots for axially guided insertion of the housing from the opposite side of the board with said stop surfaces on said first pair of locater lugs locating the housing for rotation into the aforesaid locked position with the board held between said first and second pair of lugs, terminals on said housing located in electrical contact with said board when said housing is in its rotatably locked position, said first and second pair of locater lugs and the stop surfaces thereon preventing movement of the housing totally through said hole upon insertion of the housing from opposite sides thereof.

3. A printed circuit bulb socket and panel mounting assembly for connecting a bulb socket to a circuit board from either side of the board comprising: A mounting board having a circular opening with radially outer guide slots defining arcuately located index surfaces thereon, a socket housing having an outer surface for insertion through said circular opening, a first pair of axial locater lug means on said housing extending axially at only one end thereof, a second separate pair of axial locater lug means on the housing extending axially at only the opposite end thereof and including a rib segment, stop surfaces formed on said first pair of axial locater lug means, stop surfaces formed on said second pair of axial locater lug means, said first pair of locater lug means located in axially guided engagement with the index surfaces when said housing is inserted from one side of the board, said stop surfaces on said second pairs of locater lug means being engageable with the board to limit axial insertion of the housing from the one side of the board, said first pair of lug means having inclined surfaces thereon engageable with said index surfaces to draw the stop surfaces on the second pair of lug means with respect to the board upon rotation of said socket housing, coacting surfaces on said rib segments and said index surfaces positioning said socket housing at a locked position where the board is held between said first and second pairs of locater lug means, said second pair of locater lug means being locatable in alignment with said guide slots for axially guided insertion of the housing from the opposite side of the board with said stop surfaces on said first pair of locater lug means locating the housing for rotation into the aforesaid locked position with the board held between said first and second pair of lug means, terminals on said housing including ear portions supported on said stop surfaces formed on said second pair of axial locater lug means to be located in electrical contact with said board when said housing is in its locked position, said first and second pair of locater lug means and the stop surfaces thereon preventing movement of the housing totally through said hole upon insertion of the housing from opposite sides thereof.

* * * * *